United States Patent [19]
Haukness et al.

[11] Patent Number: 5,831,919
[45] Date of Patent: Nov. 3, 1998

[54] APPARATUS AND METHOD FOR A DIRECT-SENSE SENSE-AMPLIFIER WITH DECODED READ AND WRITE Y-SELECT

[75] Inventors: Brent S. Haukness, Garland; Hugh McAdams, McKinney, both of Tex.

[73] Assignee: Texas Instruments Incorporated, Dallas, Tex.

[21] Appl. No.: 756,314

[22] Filed: Nov. 25, 1996

[51] Int. Cl.$^6$ .................................................... G11C 7/00
[52] U.S. Cl. ............................................ 365/205; 365/149
[58] Field of Search ...................................... 365/205, 149

[56] References Cited

U.S. PATENT DOCUMENTS

| | | | |
|---|---|---|---|
| 4,980,863 | 12/1990 | Ogihara | 365/205 |
| 5,561,626 | 10/1996 | Fujii | 365/149 |
| 5,568,434 | 10/1996 | Jeon | 365/205 |
| 5,574,696 | 11/1996 | Murotani | 365/205 |

Primary Examiner—David C. Nelms
Assistant Examiner—Michael T. Tran
Attorney, Agent, or Firm—Robby T. Holland; Richard L. Donaldson

[57] ABSTRACT

In a dynamic random access memory, a sense amplifier has direct sense circuitry (MNRD, MNRD_, MNYSR, MNYSR_, MNYSW, MNYSR_) included therewith to minimize the effect of the parasitic impedances of the local INPUT/OUTPUT lines RES_LIO, RES_LIO_). The WRITE-ENABLE signal and the READ-ENABLE signal are each combined with the Y-SELECT signal to provide a Y-SELECT-READ and a Y-SELECT-WRITE signal. Each of these two signals, along with their complementary logic signals, control a transistor pair (MNYSR, MNYSR_; MNYSW, MNYSR_) in the direct sense circuitry, coupling the sense amplifier and the local INPUT/OUTPUT lines (RES_LIO, RES_LIO_). Because the original signal set had three enabling signals (along with their complements), the present implementation eliminates a transistor pair in the direct sense circuitry.

20 Claims, 5 Drawing Sheets

APPARATUS AND METHOD FOR A DIRECT-SENSE SENSE-AMPLIFIER WITH DECODED READ AND WRITE Y-SELECT

BACKGROUND OF THE INVENTION

1. Field of the Invention

This invention relates generally to semiconductor devices and, more particularly, to dynamic random access memory (DRAM) units. A dynamic random access memory unit includes a sense amplifier which detects the logic state of a memory unit storage element.

2. Description of the Related Art

The sense amplifier units associated with the storage capacitors of the DRAM units sense or detect the state of the charge on the capacitor and apply an output sense signal dependent on that charge state. Direct sensing has been proposed for future generations of DRAM units because of advantages in speed and because the timing of such units is less critical. A typical direct sensing configuration requires an additional six transistors between the Y-select transistors of the sense amplifier and the input/output (I/O) lines of DRAM unit. For performance reasons, these transistors should be located as close to the sense amplifier as possible. In the ideal situation, this amplifier should be a part of in the sense amplifier itself. The location of these transistors in the sense amplifier itself results in an increase in the layout area required by the sense amplifier circuit.

Figure 1:
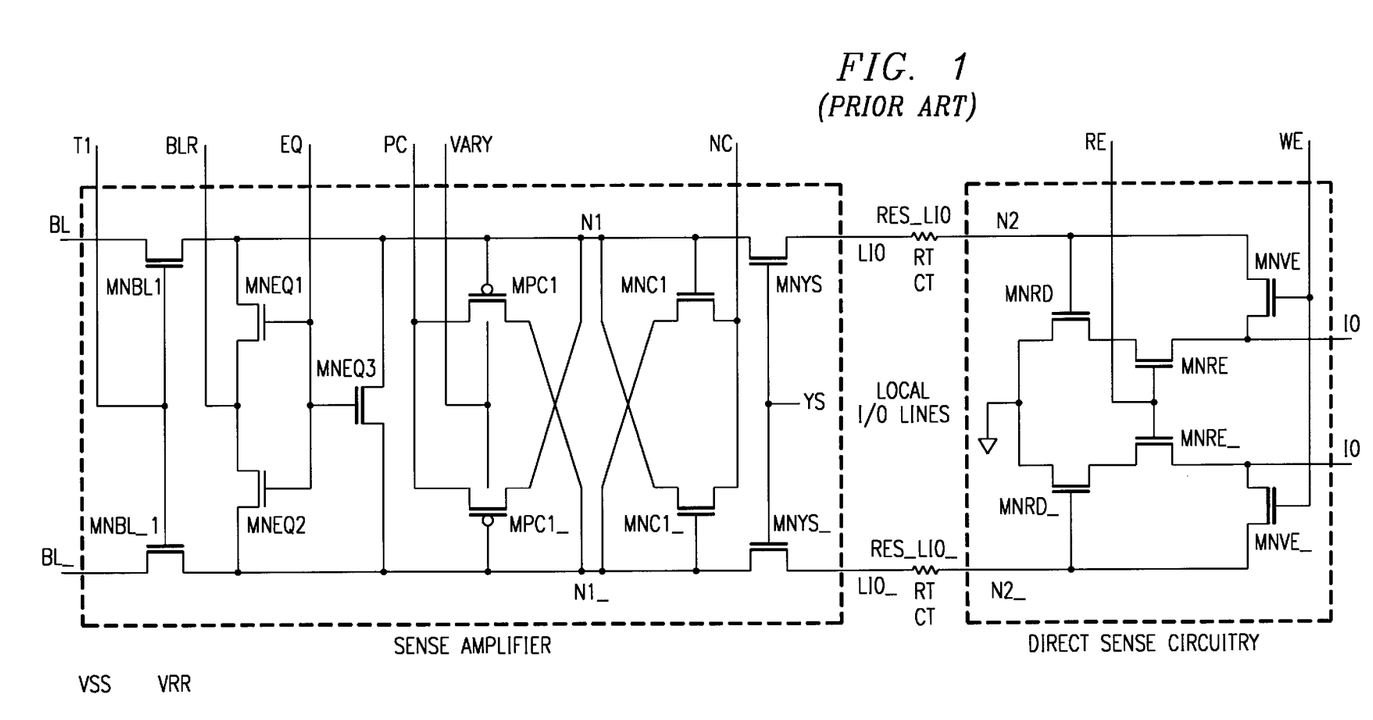
FIG. 1 is a schematic circuit diagram of a sense amplifier with an associated direct sense circuitry separated by the local I/O lines according to the prior art.

Referring to FIG. 1, a direct sense configuration for detecting the stored charge on the storage capacitor, according to the prior art, is shown. A BL signal is applied to a first source-drain terminal of n-channel field effect transistor MNBL1, while a BL_ signal is applied to a first source-drain terminal of n-channel field effect transistor MNBL1_. A T1 signal is applied to a gate terminal of transistor MNBL1 and to a gate terminal of transistor MNBL1_. A second source-drain terminal of transistor MNBL1 is coupled to a first source-drain terminal of n-channel field effect transistor MNEQ1, to a first source-drain terminal of n-channel field effect transistor MNEQ3, to a first gate terminal of p-channel field effect transistor MPC1, to a first source-drain terminal of p-channel field effect transistor MPC1_, to a first source-drain terminal of n-channel field effect transistor MNC1_, to a gate terminal of n-channel field effect transistor MNC1, and to a first source-drain terminal of n-channel field effect transistor MNYS. A second source-drain terminal of transistor MNBL1_ is coupled to a first source-drain terminal of n-channel field effect transistor MNEQ2, to a second source-drain terminal of n-channel field effect transistor MNEQ3, to a gate terminal of transistor MPC1_, to a first source-drain terminal of transistor MPC1, to a first source-drain terminal of transistor MNC1, to a gate terminal of transistor MNC1_, and to a first source-drain terminal of n-channel field effect transistor MNYS_. An BLR signal is coupled to a second source-drain terminal of transistor MNEQ1 and to a second source-drain terminal of transistor MNEQ2. An EQ signal is applied to a gate terminal of transistor MNEQ1, to a gate terminal of transistor MNEQ2, and to a gate terminal of transistor MNEQ3. A PC signal is applied to a second source-drain terminal of transistor MPC1 and to a second source-drain terminal of transistor MPC1_. A VARY potential is applied to the substrates of transistors MPC1 and MPC1_. An NC signal is applied to a second source-drain terminal of MNC1 and a second source-drain terminal of MNC1_. A YS (Y-SELECT) signal is applied to a gate terminal of transistor MNYS and to a gate terminal of transistor MNYS_. A second source-drain terminal of transistor MNYS is coupled to a first terminal of a first local input/output line RES_LIO, while a second signal terminal of transistor MNYS_ is coupled to a first terminal of a second local I/O line RES_LIO_. A second terminal of local I/O line RES_LIO is coupled to a gate terminal of n-channel field effect transistor MNRD and to a first source-drain terminal of n-channel field effect transistor MNWE. A second terminal of local I/O line RES_LIO_ is coupled to a gate terminal of n-channel field effect transistor MNRD_ and to a first source-drain terminal of n-channel field effect transistor MNWE_. A first source-drain terminal of transistor MNRD and a first source-drain terminal of transistor MNRD_ are coupled to ground potential. A second source-drain terminal of transistor MNRD is coupled to a first source-drain terminal of n-channel field effect transistor MNRE, while a second source-drain terminal of transistor MNRD_ is coupled to a first source-drain terminal of n-channel field effect transistor MNRE_. A RE (READ-ENABLE) signal is applied to gate terminals of transistors MNRE and MNRE_. A WE (WRITE_ENABLE) signal is applied to gate terminals of transistors MNWE and MNWE_. A second source-drain terminal of transistor MNWE and a second source-drain terminal of transistor MNRE are coupled to a first I/O terminal. A second source-drain terminal of transistor MNWE_ and a second source-drain terminal of transistor MNRE_ are coupled to a second I/O terminal.

Figure 2:
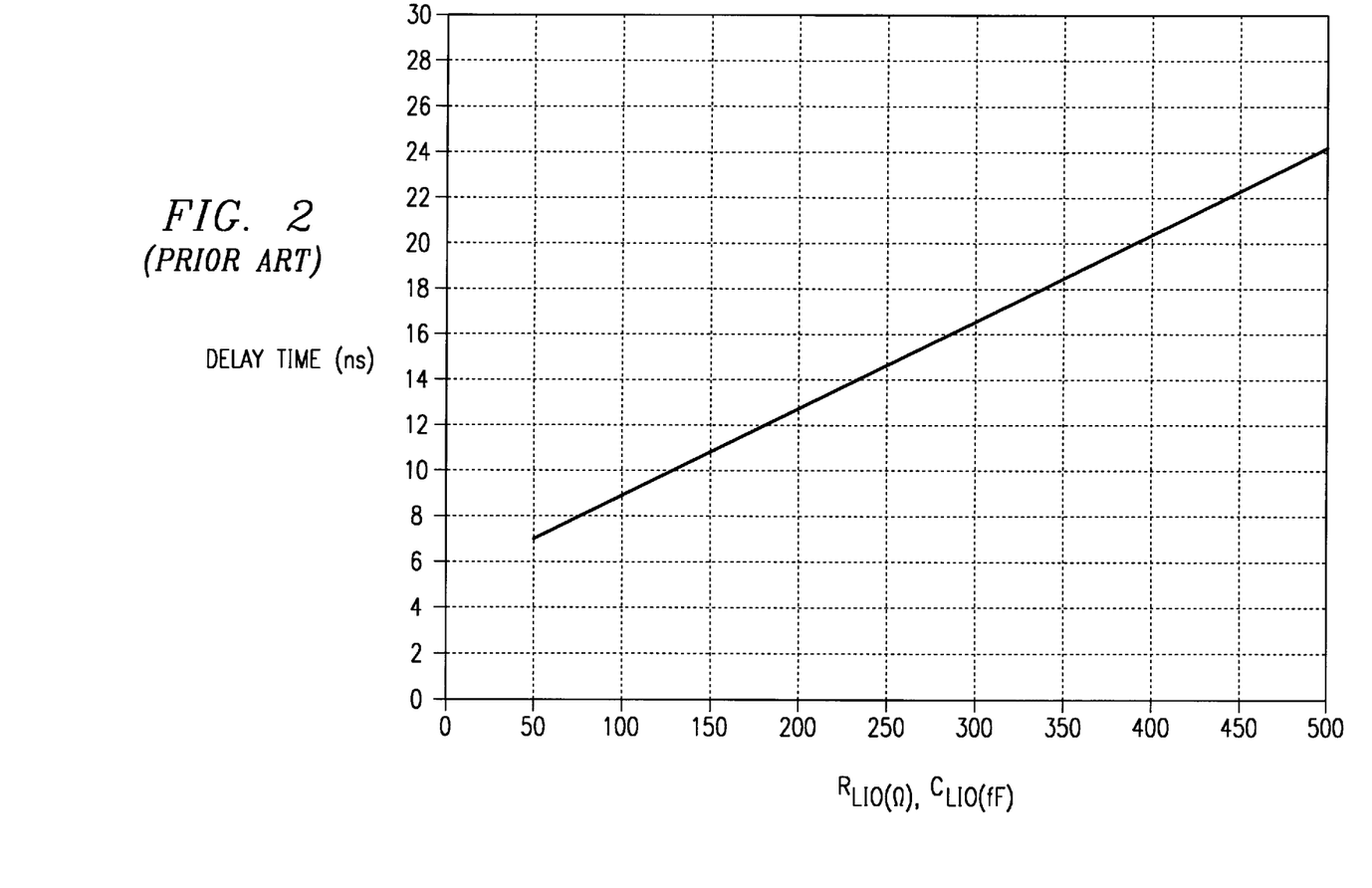
FIG. 2 is a graph of the simulated operational delay time as a function of the parasitic impedance for the sense amplifier of FIG. 1.

Referring to FIG. 2, a time delay for a read-write operation as a function of parasitic impedances for the circuit shown in FIG. 1 is shown. Removing or minimizing this delay is one of the objects of the present invention.

Figure 3:
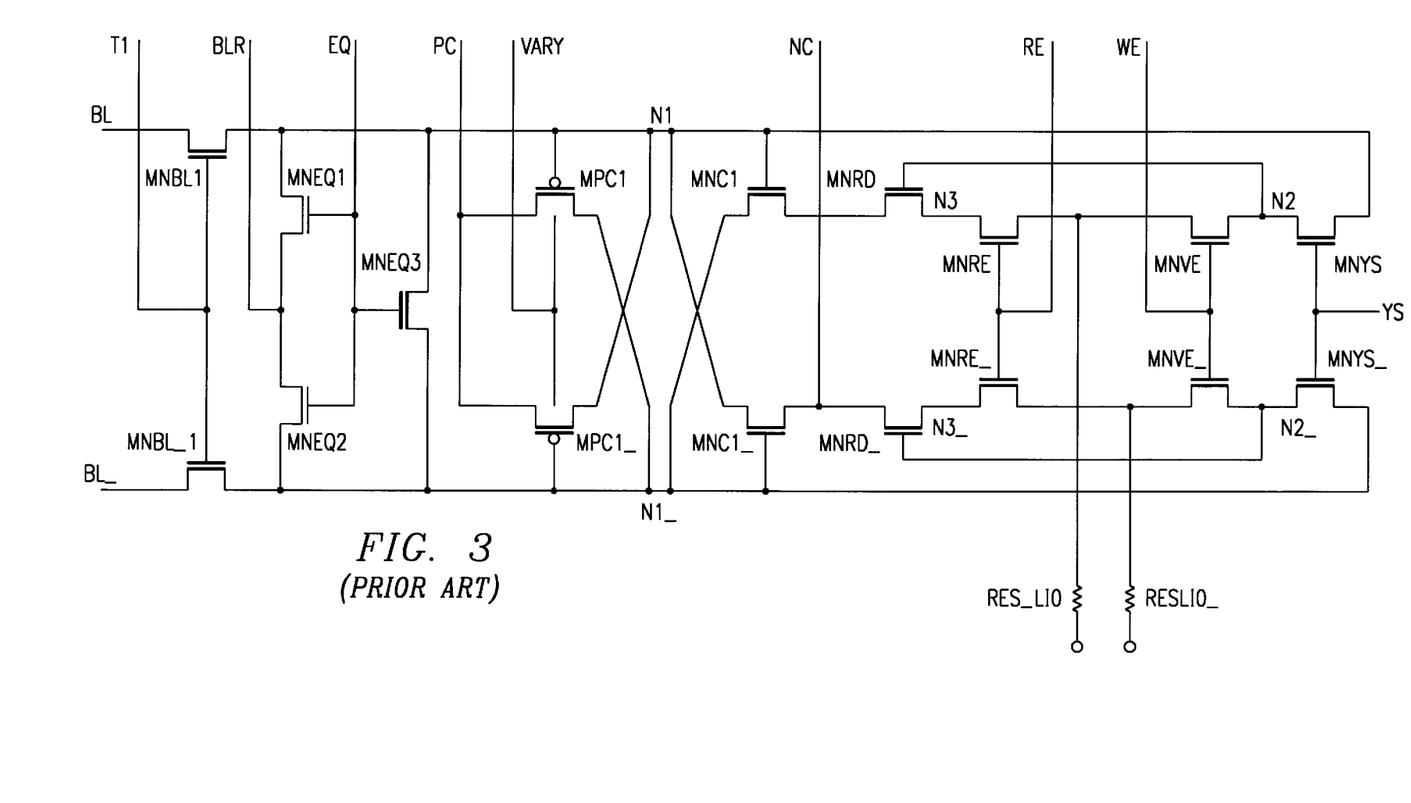
FIG. 3 is a schematic circuit diagram of a sense amplifier which includes the associated direct sense circuitry according to the prior art.

Referring to FIG. 3, a sense amplifier, including a conventional direct sense circuitry, is shown. A BL signal is coupled to a first source-drain terminal of n-channel field effect transistor MNBL, while a BL_ signal is applied to a first source-drain of n-channel field effect transistor MNBL_. A T1 signal is applied to a gate terminal of transistor MNBL and to a gate terminal of transistor MNBL_. A second signal terminal of transistor MNBL is coupled to a first source-drain terminal of n-channel field effect transistor MNEQ1, to a first source-drain terminal of n-channel field effect transistor MNEQ3, to a gate terminal of p-channel field effect transistor MPC1, to a first source-drain terminal of n-channel field effect transistor MPC1_, to a first source-drain terminal of n-channel field effect transistor MNC1_, to a gate terminal of n-channel field effect transistor MNC1_, and to a first source-drain terminal of n-channel field effect transistor MNYS. A second source-drain terminal of transistor MNBL_ is coupled to a first source-drain terminal of n-channel field effect transistor MNEQ2, to a second source-drain terminal of transistor MNEQ3, to a gate terminal of transistor MPC1_, to a first source-drain terminal of transistor MPC1, to a first source-drain terminal of transistor MNC1, to a gate terminal of transistor MNC1_, and to a first source-drain terminal of n-channel field effect transistor MNYS_. A BLR signal is applied to a second source-drain terminal of transistor MNEQ1 and to a second source-drain terminal of transistor MNEQ2. An EQ signal is applied to a gate terminal of transistor MNEQ1, to a gate terminal of transistor MNEQ2, and to a gate terminal of transistor MNEQ3. A PC signal is applied to a second source-drain terminal of transistor MPC1_ and to a second source-drain terminal of transistor MPC1_. A VARY potential is applied to the substrates of transistor MPC1 and transistor MNPC2_. An NC signal ia coupled to a second source-drain terminal of transistor MNC1, to a first source-drain terminal of n-channel field effect transistor MNRD, to a second source-drain terminal of transistor MNC1_, and to a first source-drain terminal of n-channel field effect transistor MNRD_. A gate terminal of transistor MNRD is coupled to a second source-drain terminal of transistor MNYS and to a second source-drain terminal of n-channel field effect transistor MNWE, while a gate terminal of transistor MNRD_ is coupled to a second source-drain terminal of transistor MNYS_ and to a first source-drain terminal of n-channel field effect transistor MNWE_. A second source-drain terminal of transistor MNRD is coupled to a first source-drain terminal of n-channel field effect transistor MNRE. A second source-drain terminal of transistor MNRD_ is coupled to a first signal terminal of n-channel field effect transistor MNRE_. A second source-drain terminal of transistor MNRE is coupled to a second source-drain terminal of transistor MNWE and to the local input/output line RES_LIO, while a second terminal of transistor MNRE_ is coupled to a second source-drain terminal of transistor MNWE_ and to a local output line RES_LIO_. An RE signal is coupled to the gate terminal of transistor MNRE and to the gate terminal of transistor MNRE_. A WE signal is coupled to a gate terminal of transistor MNWE and to a gate terminal of transistor MNWE_.

In the direct sensing implementation shown in FIG. 1, the output signals from the sense amplifier are coupled to the gates of read transistors MNRD/MNRD_ through the local I/O lines. In the read operation, the RE (READ-ENABLE) signal is high and the WE (WRITE-ENABLE) signal is low, thereby connecting the read transistors to the I/O lines through the MNRE/MNRE_ transistor pair. Similarly, in a write operation, the WE signal is high and the RE signal is low, thereby connecting the I/O lines directly to the local I/O lines through the MNWE/MNWE_ transistor pair and therefore to the selected sense amplifier through the MNYS/ MNYS_ transistor pair. Using this implementation, a plurality of sense amplifiers can be connected to one set of direct-sense transistors as long as only one YS (Y-SELECT) signal is high for sense amplifiers. A principal disadvantage of this approach is that the output data delay is highly dependent on the parasitic impedances of the local I/O lines (RES_LIO/RES_LIO_) as shown in FIG. 2. It is desirable to provide local I/O lines that are as short as possible.

Figure 4:
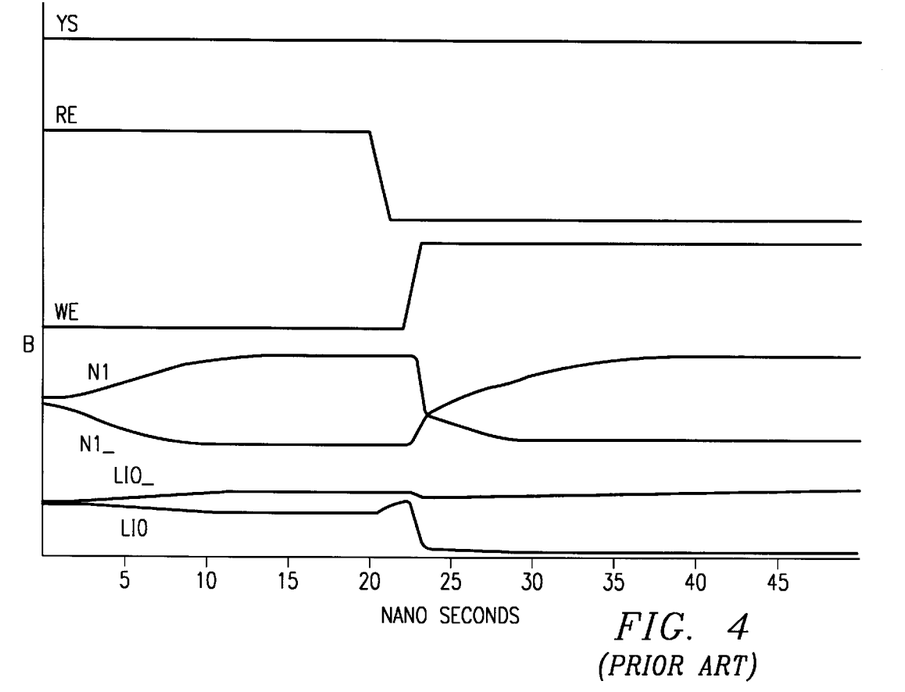
FIG. 4 is a series of graphs showing the simulated time dependence of selected signals for the sense amplifier unit of FIG. 3.

Referring to FIG. 3, the sensing delay associated with the parasitic impedances is minimized by placing the direct-sense circuitry within the sense amplifier itself. The direct-sense circuitry has six related transistors, MNRD/MNRD_, MNRE/MNRE_, and MNWE/MNWE_ in addition to the typical sense amplifier configuration. The RE (READ-ENABLE) and WE (WRITE-ENABLE) signals are global to the entire sense amplifier bank, while the YS (Y-SELECT) signal is high only for the accessed sense amplifier. In the read operation, the RE signal is high, the WE signal is low, and the YS signal is for the selected sense amplifier. This combination of signals causes the nodes N1 and N2, associated with the second terminals of the MNBL/MNBL_ transistor, pair to be coupled to the gate terminals of the MNRD/MNRD_ read transistor pair through the MNYS/ MNYS_ transistor pair. The MNRD/MNRD_ read transistor pair are coupled to the local I/Os (RES_LIO/RES_LIO_) through the MNRE/MNRE_ transistor pair as a result of the high RE signal. In a write operation, the RE signal is low, the WE signal is high, and the YS signal is once again high for the selected sense amplifier. This combination of signals couples the RES_LIO/RES_LIO_ the sense nodes N1 and N2 (i.e. second terminals of the MNBL/MNBL$_{13}$ transistor pair) through the MNWE/MNWE_ transistor pair and the MNYS/MNYS_ transistor pair, thereby bypassing the MNRD/MNRD_ transistor pair. The wave forms of FIG. 4 illustrate this operation for a read-write cycle. The parasitic impedances between the sense nodes and the direct-sense transistors are minimized with this approach. However, the layout area (i.e., of the sense amplifier is greatly increased.

A need has therefore been felt for a sense amplifier including direct-sense circuitry which requires a reduced layout area. In the present invention, the reduced layout area is achieved by reducing the number transistors in the direct-sense circuitry implementation.

SUMMARY OF THE INVENTION

The aforementioned and other features are accomplished, according to the present invention, by combining, in a sense amplifier having direct-sense circuitry included therein, the WRITE-ENABLE (WE) and the READ-ENABLE (RE) signals with the Y-SELECT (YS) signal to provide a Y-SELECT-WRITE (YSW) signal and a Y-SELECT-READ (YSR) signal. In the prior art, the WRITE-ENABLE signal, the READ-ENABLE signal, and the Y-SELECT signal, along with each signal complement, each control a transistor pair in coupling the selected sense amplifiers to the local I/O lines. In the present invention, the Y-SELECT-WRITE and the Y-SELECT-READ signals, along with each signal complement, also each control a transistor pair in coupling the selected sense amplifier to the local I/O lines. This configuration permits the sense amplifier to be implemented with two fewer transistors, thereby reducing the required layout area.

These and other features of the present invention will be understood upon the reading of the Specification in conjunction with the Figures.

DESCRIPTION OF THE PREFERRED EMBODIMENT(S)

1. Detailed Description of the Drawings

FIG. 1, FIG. 2, FIG. 3, and FIG. 4 have been described with respect to the prior art.

Figure 5:
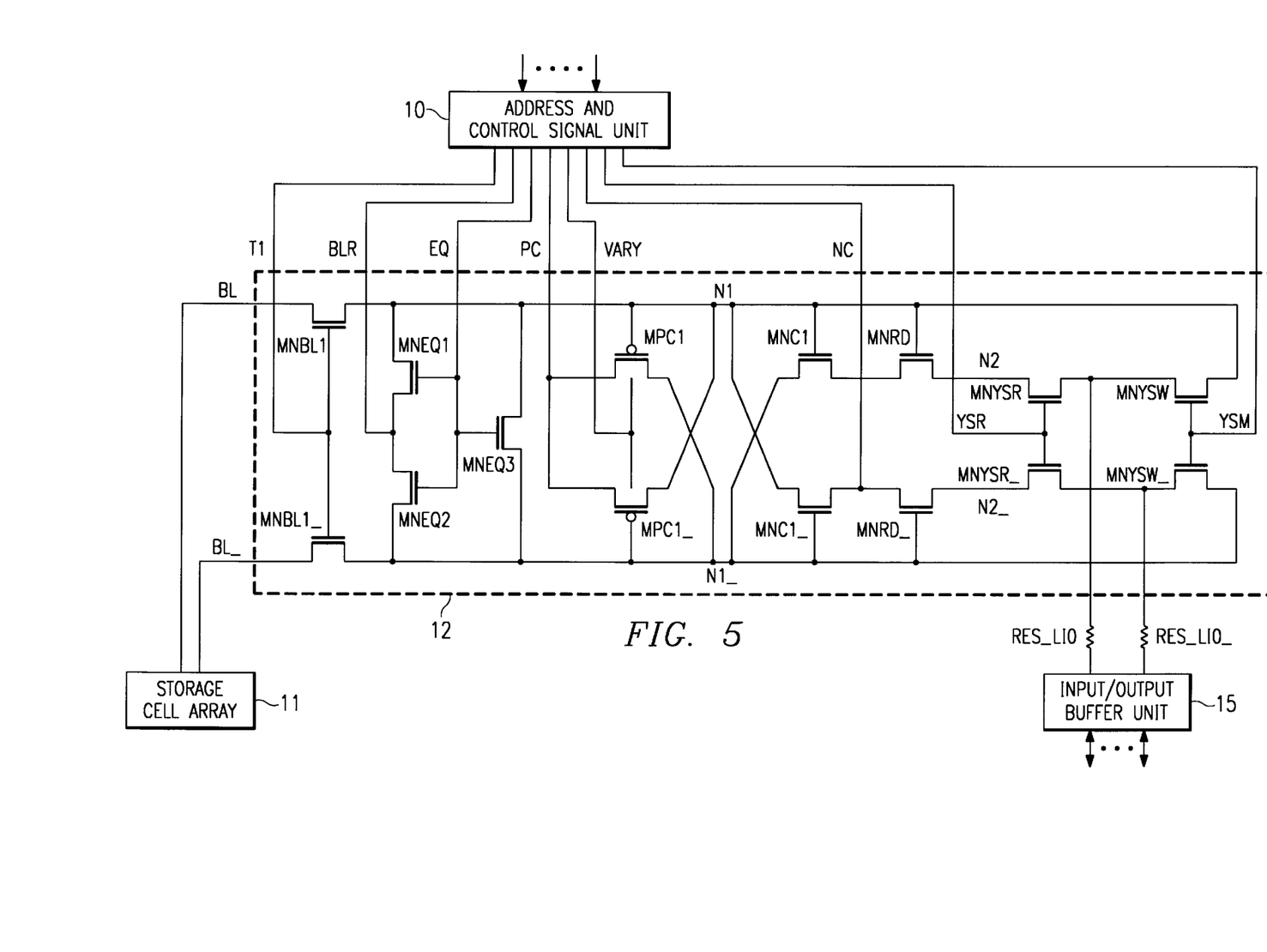
FIG. 5 is a schematic circuit diagram of a sense amplifier which includes the associated direct sense circuitry according to the present invention.

Referring now to FIG. 5, a sense amplifier with direct sense circuitry, according to the present invention, as well as the portions of the dynamic random access memory coupled thereto, is shown. A BL signal is applied to a first source-drain terminal of n-channel field effect transistor MNBL1, while a BL$_{13}$ signal is applied to a first source-drain terminal of n-channel field effect transistor MNBL1_. A T1 signal is applied to a gate terminal of transistor MNBL1 and to a gate terminal of transistor MNBL1_. A second source-drain terminal of transistor MNBL1 (node N1) is coupled to a first source-drain terminal of n-channel field effect transistor MNEQ1, to a first source-drain terminal of n-channel field effect transistor MNEQ3, to a gate terminal of p-channel field effect transistor MPC1, to a first source-drain terminal of p-channel field effect transistor MPC1_, to a first source-drain terminal of n-channel field effect transistor MNC1_, to a gate terminal of n-channel field effect transistor MNC1, to a gate terminal of n-channel field effect transistor MNRD, and to a first source-drain terminal of n-channel field effect transistor MNYSW. A second source-drain terminal of transistor MNBL1_(node N1_) is coupled to first source-drain terminal of n-channel field effect transistor MNEQ2, to a second source-drain terminal of transistor MNEQ3, to a gate terminal of transistor MPC1_, to a first source-drain terminal of transistor MPC1, to a first source-drain terminal of transistor MNC1, to a gate terminal of transistor MNC1_, to a gate terminal of n-channel field effect transistor MNRD_, and to a first source-drain terminal of n-channel field effect transistor MNYSW_. A BLR signal is applied to a second source-drain terminal of transistor MNEQ1 and to a second source-drain terminal of transistor MNEQ2. An EQ signal is applied to a gate terminal of transistor MNEQ1, to a gate terminal of transistor MNEQ2, and to a gate terminal of transistor MNEQ3. A PC signal is applied to a second source-drain terminal of transistor MPC1 and to a second source-drain terminal of transistor MPC1_. A VARY potential is applied to the substrates of transistor MPC1 and transistor MPC1_. An NC signal is applied to a second source-drain terminal of transistor MNC1, a first source-drain terminal of transistor MNRD, a second source-drain terminal of transistor MNC1_, and to a first source-drain terminal of transistor MNRD_. A second source-drain terminal of transistor MNRD is coupled to a first source-drain terminal of n-channel field effect transistor MNYSR, while a second source-drain terminal of transistor MNRD_is coupled to a first source-drain terminal of n-channel field effect transistor MNYSR_. A YSW signal is applied to a gate terminal of transistor MNYSW and to a gate terminal transistor MNYSW_. A YSR signal is applied to a gate terminal of transistor MNYSR and a gate terminal of transistor MNYSR_. A second source-drain terminal of transistor MNYSR and a second source-drain terminal of MNYSW are coupled to a first local input/output line RES_LIO. A second source-drain terminal of transistor MNYSW_and a second source-drain terminal of transistor MNYSR_are coupled to a second input/output line RES_ LIO_. The sense amplifier 12 exchanges data signals with the storage cell array 11, with the direct sense circuit 11 via nodes N1 and N1_, and receives control and address signals from the address and control unit 10. The address and control unit 10 provides signals T1,BLR, EQ,PC,VARY, and NC to the sense amplifier. In addition, according to the present invention, the address and control unit 10 provides the combined Y-SELECT-WRITE (YSW) signal and the combined Y-SELECT-READ (YSR) signal to the direct sense circuit. The sense amplifier 12 also exchanges signals with the I/O buffer unit, 15.

Figure 6:
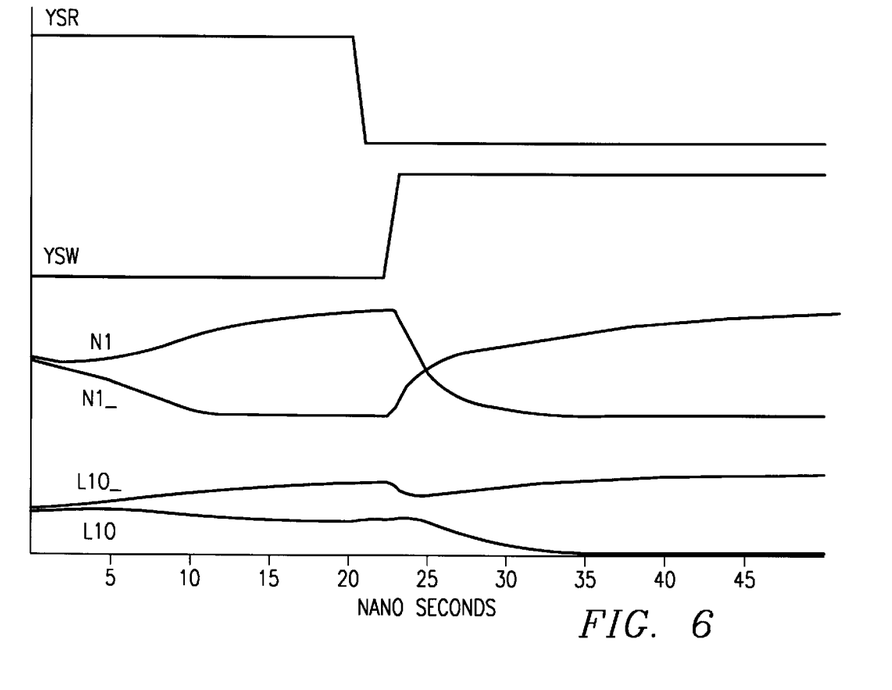
FIG. 6 is a series of graphs showing the simulated time dependence of selected signals for the sense amplifier of FIG. 5.

Referring to FIG. 6, the simulated time dependence of the sense amplifier of the present invention is shown in relation to the activation signals.

2. Operation of the Preferred Embodiment(s)

Referring once again to FIG. 5, the sense amplifier with the direct sense circuitry of the present invention is shown.

In addition to the sense amplifier, only four additional transistors, MNYSR/MNYSR_and MNRD/MNRD_, are required. The MNYSW/MNSYW_are equivalent to the typical Y-select transistors MNYS/MNYS_shown in FIG. 1. The reduction in the number of transistors is obtained by using separate, decoded Y-select signals, a YSR (Y-SELECT READ) signal and a YSW (Y-SELECT WRITE) signal, for the read and write operations respectively. The global READ-ENABLE signal and the global WRITE-ENABLE signals, used in the conventional implementations, are not required in the present configuration.

The gates of the read transistor pair MNRD/MNRD_are always coupled to the sense nodes. In a read operation, all the YSW signals in the sense amplifier bank are low. The YSR signal is high for the selected sense amplifier, thereby coupling the MNRD/MNRD_transistor pair to the local I/O lines through the MNYSR/MNYSR_transistor pair. Similarly, in the write operation, all of the YSR signals are low in the sense amplifier bank and only the YSW signal for the selected sense amplifier is high. The high YSW signal provides a direct coupling of the local I/O lines to the sense nodes N1/N1_through the transistor pair MNYSW/ MNYSW_.

Referring to FIG. 6, a comparison between FIG. 6 and FIG. 4 illustrates that the present implementation of the direct-sensing circuitry with the sense amplifier retains the feature of minimizing the effect of local I/O parasitic impedances. Moreover, the present configuration is implemented with a reduced number of transistors, thereby reducing the layout area required for the sense amplifier.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A sense amplifier unit for a semiconductor memory device comprising:

local input/output line pair;

a sense amplifier; and a direct sense circuit coupling said sense amplifier and said local input/output line pair, said direct sense circuit including;

first and second transistors for coupling said local input/output line pair and said sense amplifier, said first and second transistors each responsive to a first signal including control and address information for selectively causing transmission of a data signal from said local input/output line pair to said sense amplifier; and third and fourth transistors for coupling said sense amplifier and said local input/output line pair, said third and fourth transistors each responsive to a second signal including control and address information for selectively causing transmission of a data signal from said sense amplifier to said local input/output line pair.

2. The sense amplifier unit of claim 1 wherein said first signal is a combination of a WRITE-ENABLE signal and a Y-SELECT signal and said second signal is a combination of a READ-ENABLE signal and said Y-SELECT signal.

3. The sense amplifier unit of claim 1 wherein said first signal is applied directly to the gates of said first and second transistors.

4. The sense amplifier unit of claim 1 wherein said semiconductor memory device is a dynamic random access memory device.

5. The sense amplifier unit of claim 1 wherein said third and fourth transistors each have a current path and a control gate and wherein said direct sense circuit further comprises:

fifth and sixth transistors each having a current path and a control gate, the current paths of said fifth and sixth transistors are coupled between a reference potential and the current paths of said third and fourth transistors respectively; and wherein said control gates of said fifth and sixth transistors are responsive to data signal from said sense amplifier and the current paths of said third and fourth transistors are coupled between the current paths of said fifth and sixth transistors and the local input/output line pair.

6. The semiconductor memory device of claim 1 further comprising a bank of said sense amplifier units and wherein said first signal selects among said sense amplifier units within the bank of said sense amplifier units according to said address information.

7. A method of coupling a sense amplifier and a pair of local input/output lines, the method comprising the steps of:

applying a first signal including control and address information to each of a first and second transistor for coupling said sense amplifier and said local input/output lines, said first and second transistors selectively transferring a data signal from said local input/output lines to said sense amplifier in response to said first signal; and applying a second signal including control and address information to each of a third and fourth transistor for coupling said sense amplifier and said local input/output lines, said second signal selectively causing a data signal to be transferred from said sense amplifier to said local input/output lines.

8. The method of claim 7 wherein said applying a first signal includes the step of combining a WRITE-ENABLE signal and a Y-SELECT signal to form said first signal; and wherein said applying a second signal includes the step of combining a READ-ENABLE signal and a Y-SELECT signal to form said second signal.

9. A semiconductor dynamic random access memory unit comprising:

a storage cell array for storing data signals;

a sense amplifier for applying data signals to and receiving data signals from said storage cell array;

an input/output buffer unit;

input/output lines for transmitting signals to and from said input/output buffer unit; and a direct sense circuit coupled between said input/output buffer unit and said sense amplifier, said direct sense circuit comprising:

first and second transistors each selectively transmitting a data signal from said input/output lines to said sense amplifier in response to a first control signal including control and address information;

third and fourth transistors each selectively transmitting a data signal from said sense amplifier to said input/output lines in response to a second control signal including control and address information.

10. The dynamic random access memory unit of claim 9 wherein said first control signal is a combination of a WRITE-ENABLE signal and a Y-SELECT signal.

11. The dynamic random access memory unit of claim 10 wherein said second control signal is a combination of a READ-ENABLE signal and said Y-SELECT signal.

12. The dynamic random access memory unit of claim 9 wherein said third and fourth transistors each have a current path and a control gate and wherein said direct sense circuit further comprises:

fifth and sixth transistors each having a current path and a control gate, the current paths of said fifth and sixth transistors are coupled between a reference potential and the current paths of said third and fourth transistors respectively; and wherein said control gates of said fifth and sixth transistors are responsive to data signal from said sense amplifier, and the current paths of said third and fourth transistors are coupled between the current paths of said fifth and sixth transistors and the input/output lines.

13. The dynamic random access memory unit of claim 6 further comprising a plurality of direct sense circuits, each of said direct sense circuits coupled to only one sense amplifier.

14. The semiconductor dynamic random access memory unit of claim 9 further comprising a bank of said sense amplifiers and wherein said first control signal selects among said sense amplifiers within the bank of said sense amplifiers according to said address information.

15. A sense configuration for a semiconductor memory device comprising:

an input/output line;

a sense amplifier; and a direct sense circuit coupling said sense amplifier and said input/output line, said direct sense circuit including;

a first transistor for coupling said input/output line and said sense amplifier, said first transistor is responsive to a first signal comprising write and address information for selectively causing transmission of a data signal from said input/output line to said sense amplifier; and a second transistor for coupling said sense amplifier and said local input/output line, said second transistor is responsive to a second signal comprising read and address information for selectively causing transmission of a data signal from said sense amplifier to said input/output line.

16. The sense configuration of claim 15 wherein said first signal is a combination of a WRITE-ENABLE signal and a Y-SELECT signal and said second signal is combination of a READ-ENABLE signal and said Y-SELECT signal.

17. The sense configuration of claim 15 wherein said semiconductor memory device is a dynamic random access memory.

18. The sense configuration of claim 15 wherein said second transistor has a current path and a control gate and wherein said direct sense circuit further comprises:

a third transistor having a current path and a control gate, the current path of said third transistor coupled between a reference potential and the current path of said second transistor; and wherein said control gate of said third transistor is responsive to a data signal from said sense amplifier and the current path of said second transistor is coupled between the current path of said third transistor and said input/output line.

19. The sense configuration of claim 15 further comprising a plurality of direct sense circuits, each of said direct sense circuits coupled to only one sense amplifier.

20. The semiconductor memory device of claim 15 further comprising a bank of said sense amplifiers and wherein said first signal selects among said sense amplifiers within the bank of said sense amplifiers according to said address information.

* * * * *